United States Patent
Wang et al.

(10) Patent No.: US 10,423,025 B2
(45) Date of Patent: Sep. 24, 2019

(54) CURVED DISPLAY PANEL, CURVED DISPLAY APPARATUS, AND FABRICATING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiao Wang, Beijing (CN); Yu Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 40 days.

(21) Appl. No.: 15/542,061

(22) PCT Filed: Jan. 23, 2017

(86) PCT No.: PCT/CN2017/072208
§ 371 (c)(1),
(2) Date: Jul. 6, 2017

(87) PCT Pub. No.: WO2017/190536
PCT Pub. Date: Nov. 9, 2017

(65) Prior Publication Data
US 2018/0210277 A1 Jul. 26, 2018

(30) Foreign Application Priority Data
May 6, 2016 (CN) .......................... 2016 1 0298090

(51) Int. Cl.
*G02F 1/1335* (2006.01)
*H01L 51/56* (2006.01)
(Continued)

(52) U.S. Cl.
CPC ...... *G02F 1/133512* (2013.01); *G02F 1/1368* (2013.01); *G02F 1/133305* (2013.01);
(Continued)

(58) Field of Classification Search
CPC .................... G02F 1/133512; G02F 1/133514
See application file for complete search history.

(56) References Cited

U.S. PATENT DOCUMENTS 7,638,802 B2 * 12/2009 Song ..................... H01L 27/124
 257/40
8,169,559 B2 * 5/2012 Woo ................... G02F 1/134363
 345/96
(Continued)

FOREIGN PATENT DOCUMENTS

CN 102411914 A 4/2012
CN 202975548 U 6/2013
(Continued)

OTHER PUBLICATIONS

First Office Action in the Chinese Patent Application No. 201610298090.6, dated Mar. 20, 2018; English translation attached.
(Continued)

*Primary Examiner* — James A Dudek
(74) *Attorney, Agent, or Firm* — Intellectual Valley Law, P.C.

(57) ABSTRACT

The present application discloses a curved display panel having an array of a plurality of pixels along a first direction and a second direction intersecting the first direction. Each of the plurality of pixels includes at least three subpixels of different colors, the at least three subpixels in a same pixel are consecutively along the first direction, a plurality of subpixels consecutively along the second direction in a same row are of a same color from different pixels. The curved display panel includes a display surface curved along a
(Continued)

curvature direction. The curvature direction is substantially parallel to the second direction.

16 Claims, 8 Drawing Sheets

(51) Int. Cl.
*G02F 1/1333* (2006.01)
*G02F 1/1362* (2006.01)
*G02F 1/1368* (2006.01)
*H01L 27/32* (2006.01)
*H01L 51/00* (2006.01)
*H01L 51/52* (2006.01)

(52) U.S. Cl.
CPC .. *G02F 1/133514* (2013.01); *G02F 1/136286* (2013.01); *H01L 27/322* (2013.01); *H01L 27/3218* (2013.01); *H01L 51/0097* (2013.01); *H01L 51/5237* (2013.01); *H01L 51/56* (2013.01); *G02F 2201/121* (2013.01); *G02F 2201/123* (2013.01); *G02F 2201/52* (2013.01)

(56) References Cited

U.S. PATENT DOCUMENTS

| | | | | |
|---|---|---|---|---|
| 8,350,795 B2* | 1/2013 | Kim | ............ | G02F 1/136286 345/204 |
| 9,395,592 B2* | 7/2016 | Seo | ............ | G02F 1/136286 |
| 9,835,920 B2* | 12/2017 | Song | ............ | G02F 1/136213 |
| 2006/0197882 A1* | 9/2006 | Oh | ............ | G02F 1/136286 349/43 |
| 2007/0103613 A1* | 5/2007 | Song | ............ | H01L 27/124 349/43 |
| 2009/0015768 A1* | 1/2009 | Igeta | ............ | G02F 1/133512 349/106 |
| 2009/0161048 A1 | 6/2009 | Satake et al. | | |
| 2013/0135186 A1 | 5/2013 | Zhang et al. | | |
| 2015/0055042 A1* | 2/2015 | Chung | ............ | G02F 1/134336 349/42 |
| 2015/0160509 A1* | 6/2015 | Lee | ............ | G02F 1/133528 349/42 |
| 2015/0234239 A1 | 8/2015 | Son et al. | | |
| 2015/0294986 A1 | 10/2015 | Moon | | |
| 2016/0178961 A1* | 6/2016 | No | ............ | G02F 1/133512 349/106 |
| 2016/0202575 A1* | 7/2016 | Youk | ............ | G02F 1/134336 349/110 |
| 2016/0209712 A1* | 7/2016 | Lee | ............ | G02F 1/134309 |
| 2016/0238908 A1* | 8/2016 | Kim | ............ | G02F 1/134336 |
| 2016/0253970 A1* | 9/2016 | Chen | ............ | G02F 1/1333 345/214 |
| 2016/0320675 A1* | 11/2016 | Lee | ............ | G02F 1/134309 |
| 2017/0047025 A1* | 2/2017 | Yun | ............ | G09G 3/3659 |
| 2017/0097546 A1* | 4/2017 | Lazo Martinez et al. ............ G02F 1/133514 | | |
| 2017/0123245 A1* | 5/2017 | Iwai | ............ | G02F 1/133514 |
| 2017/0255069 A1* | 9/2017 | Wu | ............ | G02F 1/133345 |
| 2018/0173034 A1* | 6/2018 | Yonemura | ............ | G02F 1/13394 |
| 2018/0210277 A1* | 7/2018 | Wang | ............ | H01L 51/0097 |

FOREIGN PATENT DOCUMENTS

| | | |
|---|---|---|
| CN | 103345092 A | 10/2013 |
| CN | 104035224 A | 9/2014 |
| CN | 104423079 A | 3/2015 |
| CN | 104849894 A | 8/2015 |
| CN | 105137650 A | 12/2015 |
| CN | 205564754 U | 9/2016 |
| JP | 2008111890 A | 5/2008 |

OTHER PUBLICATIONS

International Search Report & Written Opinion dated Apr. 11, 2017, regarding PCT/CN2017/072208.
Third Office Action in the Chinese Patent Application No. 201610298090.6, dated Mar. 6, 2019; English tanslation attached.

* cited by examiner

CURVED DISPLAY PANEL, CURVED DISPLAY APPARATUS, AND FABRICATING METHOD THEREOF

CROSS-REFERENCE TO RELATED APPLICATION

This application is a national stage application under 35 U.S.C § 371 of International Application No. PCT/CN2017/072208 filed Jan. 23, 2017, which claims priority to Chinese Patent Application No. 201610298090.6, filed May 6, 2016, the contents of which are incorporated by reference in the entirety.

TECHNICAL FIELD

The present invention relates to display technology, more particularly to a curved display panel, a curved display apparatus having the same, and a fabricating method thereof.

BACKGROUND

Convention display devices are usually flat. In recent years, display apparatuses having a curved display surface have been proposed for design or other reasons. Typically, a display panel is first bent by force to achieve desired curvature. The bent display panel is then secured to a mold frame. Curved display apparatuses have a wider viewing angle and provide a better viewing experience for a viewer. Curved display apparatuses have found a wide range of applications in display field, including computer monitors, televisions, and personal portable devices.

SUMMARY

In one aspect, the present invention provides a curved display panel comprising an array of a plurality of pixels along a first direction and a second direction intersecting the first direction; wherein each of the plurality of pixels comprises at least three subpixels of different colors; the at least three subpixels in a same pixel are consecutively along the first direction; a plurality of subpixels consecutively along the second direction in a same row are of a same color from different pixels; the curved display panel comprises a display surface curved along a curvature direction; and the curvature direction is substantially parallel to the second direction.

Optionally, any light emitted from a subpixel and transmitted through a color filter unit corresponding to an adjacent subpixel due to pixel misalignment has a same color as light emitted from the subpixel and transmitted through a color filter unit corresponding to the subpixel.

Optionally, the curved display panel comprises an array substrate comprising a plurality of gate lines and a plurality of data lines; each of the plurality of gate lines extends substantially along the second direction; and each of the plurality of data lines extends substantially along the first direction.

Optionally, the curved display panel comprises a plurality of groups of rows of subpixels along the first direction, each of the plurality of groups of rows of subpixels comprising at least two adjacent rows of subpixels, subpixels in each of the at least two adjacent rows of subpixels being along the second direction.

Optionally, each of the plurality of groups of rows of subpixels comprising two adjacent rows of subpixels; each subpixel of the plurality of groups of rows of subpixels comprises a switching transistor; each of the plurality of groups of rows of subpixels is associated with one of the plurality of gate lines, which is between the two adjacent rows of subpixels of each of the plurality of groups of rows of subpixels, and is coupled to each switching transistor of each subpixel of the plurality of groups of rows of subpixels; each two adjacent columns of subpixels of each of the plurality of groups of rows of subpixels is associated with two adjacent data lines of the plurality of data lines, which are between each two adjacent columns of subpixels of each of the plurality of groups of rows of subpixels; and the two adjacent data lines associated with each two adjacent columns of subpixels of each of the plurality of groups of rows of subpixels are respectively coupled to source electrodes of two switching transistors of two subpixels in different rows from each two adjacent columns of subpixels.

Optionally, the plurality of gate lines are configured to sequentially scan the plurality of groups of rows of subpixels group-by-group along the first direction in a plurality of scanning stages of a scanning cycle, each of the plurality of groups of rows of subpixels being scanned in a same scanning stage of the scanning cycle.

Optionally, each of the plurality of groups of rows of subpixels comprises rows of subpixels, subpixels in each of the four adjacent rows of subpixels being along the second direction.

Optionally, the carved display panel further comprises a plurality of color filter layers of different colors; each of the plurality of color filter layers comprising a plurality of color filter units of a same color; wherein each of the plurality of pixels comprises at least three color filter units of different colors; the at least three color filter units of different colors in a same pixel are consecutively along the first direction; and a plurality of color filter units consecutively in a same row along the second direction are of a same color from different pixels.

Optionally, the plurality of color filter layers of different colors comprise a color filter layer of a first color, a color filter layer of a second color, and a color filter layer of a third color; wherein the color filter layer of the first color comprises a plurality of rows of color filter units of the first color along the second direction; the color filter layer of the second color comprises a plurality of rows of color filter units of the second color along the second direction; the color filter layer of the third color comprises a plurality of rows of color filter units of the third color along the second direction; and each of the plurality of pixels comprises one color filter unit of the first color, one color filter unit of the second color, and one color filter unit of the third color, consecutively along the first direction.

Optionally, the curved display panel comprises a curved liquid crystal display panel; the plurality of color filter layers of different colors are in a color filter substrate facing the array substrate; the color filter substrate further comprises a black matrix layer between any two adjacent rows of subpixels, subpixels in each of the two adjacent rows of subpixels being along the second direction; the black matrix layer is absent in an inter-subpixel region between adjacent subpixels along the second direction; the array substrate further comprises a pixel electrode layer and a common electrode layer, the pixel electrode layer and the common electrode layer being in two different layers; and the common electrode layer substantially covers the plurality of data lines.

Optionally, the black matrix layer substantially covers transistors in subpixels of the curved display panel.

Optionally, the curved display panel comprises a pixel electrode layer, a common electrode layer, a plurality of common electrode lines coupled to the common electrode layer and substantially parallel to the plurality of gate lines, and a plurality of auxiliary conductive lines coupled to the common electrode layer and substantially parallel to the plurality of data lines.

Optionally, the plurality of gate lines and the plurality of common electrode lines are in a same layer; and the plurality of data lines and the plurality of auxiliary conductive lines are in a same layer.

Optionally, the curved display panel comprises a pixel electrode layer, a common electrode layer, a plurality of common electrode lines coupled to the common electrode layer and substantially parallel to the plurality of gate lines, and a plurality of auxiliary conductive lines coupled to the common electrode layer and substantially parallel to the plurality of data lines; wherein each of the plurality of auxiliary conductive lines is between the two adjacent data lines between each two adjacent columns subpixels of each of the plurality of groups of rows of subpixels; and the plurality of auxiliary conductive lines and the plurality of data lines are in a same layer.

Optionally, the curved display panel comprises a curved organic light emitting diode display panel; the plurality of color filter layers of different colors are in an encapsulating substrate facing the array substrate; the array substrate timber comprises an anode layer, a cathode layer, and an organic light emitting layer between the anode layer and the cathode layer, the organic light emitting layer being a white light emitting layer; the encapsulating substrate further comprises a black matrix layer between any two adjacent rows of subpixels, subpixels in each of the two adjacent rows of subpixels being along the second direction; the black matrix layer is absent in an inter-subpixel region between adjacent subpixels along the second direction.

Optionally, the black matrix layer covers transistors in subpixels of the curved display panel.

In another aspect, the present invention provides a curved display apparatus comprising the curved display panel described herein.

In another aspect, the present invention provides a method of fabricating a curved display panel, comprising forming a display panel comprising an array of a plurality of pixels along a first direction and a second direction intersecting the first direction; and curving the display panel along a curvature direction, the curvature direction being substantially parallel to the second direction; wherein each of the plurality of pixels is formed to comprise at least three subpixels of different colors; the at least three subpixels in a same pixel are formed to be consecutively along the first direction; and a plurality of subpixels consecutively along the second direction in a same row are formed to be of a same color from different pixels.

Optionally, forming the display panel comprises forming an array substrate comprising a plurality of gate lines and a plurality of data lines; each of the plurality of gate lines is formed to extend substantially along the second direction; and each of the plurality of data lines is formed to extend substantially along the first direction; the method comprising forming a plurality of groups of rows of subpixels along the first direction, each of the plurality of groups of rows of subpixels being formed to comprise at least two adjacent rows of subpixels, subpixels in each of the at least two adjacent rows of subpixels being formed to be along the second direction.

Optionally, the plurality of gate lines are configured to sequentially scan the plurality of groups of rows of subpixels group-by-group along the first direction in a plurality of scanning stages of a scanning cycle, each of the plurality of groups of rows of subpixels being scanned in a same scanning stage of the scanning cycle.

Optionally, the method further comprises forming, a plurality of color filter layers of different colors; each of the plurality of color filter layers is formed to comprise a plurality of color filter units of a same color; wherein each of the plurality of pixels is formed to comprise at least three color filter units of different colors; the at least, three color filter units of different colors in a same pixel are formed to be consecutively along the first direction; and a plurality of color filter units consecutively in a same row along the second direction are of a same color from different pixels.

Optionally, the curved display panel is a curved liquid crystal display panel; the method further comprising forming a color filter substrate facing the array substrate; the plurality of color filter layers of different colors are formed in the color filter substrate; forming the color filter substrate comprises forming a black matrix layer between any two adjacent rows of subpixels, subpixels in each of the two adjacent rows of subpixels being along the second direction; the black matrix layer is absent in an inter-subpixel region between adjacent subpixels along the second direction; forming the array substrate further includes forming a pixel electrode layer and forming a common electrode layer, the pixel electrode layer and the common electrode layer being formed in two different layers; and the common electrode layer is formed to cover the plurality of data lines.

Optionally, the method further comprises forming a pixel electrode layer, forming a common electrode layer, forming a plurality of common electrode lines coupled to the common electrode layer and substantially parallel to the plurality of gate lines, and forming a plurality of auxiliary conductive lines coupled to the common electrode layer and substantially parallel to the plurality of data lines.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
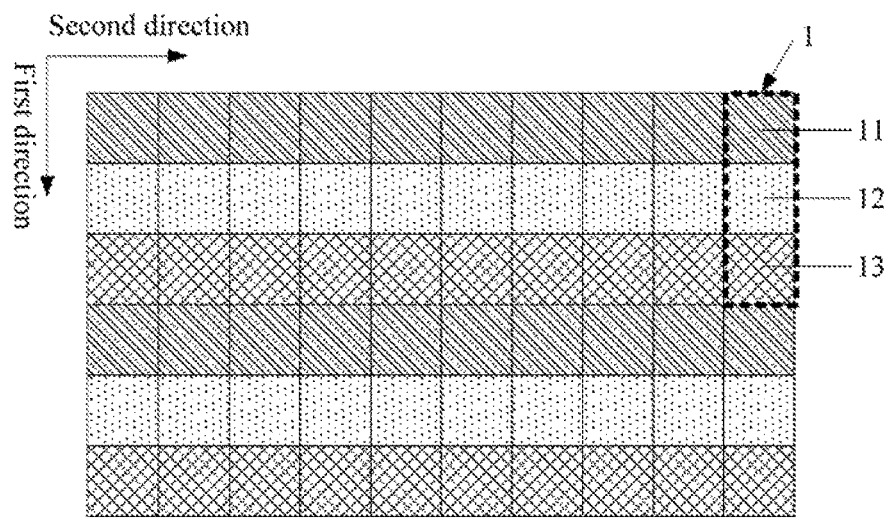
FIG. 1 is a top view of a curved display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Typically, curvature in a curved display panel is achieved by curving or bending a flat display panel by external forces. During the curving or bending process, the array substrate and the counter substrate (e.g., a color filter substrate in a liquid crystal display panel or an encapsulating substrate in an organic light emitting display panel) may undergo shift relative to each other, resulting in misalignment of pixels between the array substrate and the counter substrate. As a result of the pixel misalignment, the light emitted from a subpixel in the array substrate may be filtered through two color filter units in the counter substrate, leading to color mixing.

Accordingly, the present invention provides, inter alia, a curved display panel, a curved display apparatus having the same, and a fabricating method thereof that substantially obviate one or more of the problems due to limitations and disadvantages of the related art. In one aspect, the present disclosure provides a curved display panel. In some embodiments, the curved display panel includes a plurality of pixels arranged in an array along a first direction and a second direction intersecting the first direction in a plan view of the curved display panel. For example, the first direction may be a column direction and the second direction may be a row direction. In another example, the first direction is a vertical direction and the second direction is a horizontal direction. Optionally, the first direction is substantially orthogonal to the second direction. Optionally, each of the plurality of pixels includes at least three subpixels of different colors, e.g., a red subpixel, a green subpixel, and a blue subpixel. Optionally, each pixel includes a red subpixel, a green subpixel, a blue subpixel, and a white subpixel, in the present curved display panel, the at least three subpixels in a same pixel are consecutively arranged along the first direction. For example, the red subpixel, the green subpixel, the blue subpixel, and the white subpixel in a same pixel may be arranged along the first direction. A plurality of subpixels consecutively arranged along the second direction in a same row are of a same color from different pixels. For example, each row of array of subpixels includes exclusively a plurality of subpixels of a same color from different pixels consecutively arranged along the second direction. In one example, the array of subpixels includes a repeating arrangement of a group of four rows of subpixels, each group including a row of red subpixels, a row of green subpixels, a row of blue subpixels, and a row of white subpixels. In the present curved display panel, the display surface of the curved display panel is curved along a curvature direction. The curvature direction is substantially parallel to the second direction (e.g., a row direction of the array or a horizontal direction of the curved display panel). Optionally, the first direction is substantially orthogonal to the curvature direction of the curved display panel. For example, the curved display panel has a rectangular shape or a square shape. Optionally, the first direction is not orthogonal to the curvature direction of the curved display panel. For example, the curved display panel has a parallelogram shape.

Optionally, the curved display panel has two sides that are not curved, the two sides extend substantially along the first direction, e.g., when the curved display panel has a rectangular shape. Optionally, the curved display panel has two sides that are not curved, and at least one (e.g., both) of the two sides that are not curved extends along a direction that is different from the first direction. For example, the curved display panel may be a circular-shaped display panel or an irregularly shaped display panel, and the sides that are not curved may not be a straight line (e.g., a curved line or a wavy line). In another example, the curved display panel has a parallelogram shape, and the sides that are not curved extends along a direction at an angle to the first direction.

In some embodiments, the present curved display panel is substantially free of color mixing due to pixel misalignment as a result of the curvature. Optionally, each row of subpixels along the second direction (the curvature direction) is substantially free of color mixing because all color filter units corresponding to a same row of subpixels are of a same color. Optionally, any light emitted from a subpixel and transmitted through a color filter unit corresponding to an adjacent subpixel due to pixel misalignment has a same color as light emitted from the subpixel and transmitted through a color filter unit corresponding to the subpixel.

FIG. 1 is a top view of a curved display panel in some embodiments according to the present disclosure. Referring to FIG. 1, the curved display panel includes a plurality of pixels 1 arranged in an array along a first direction and a second direction intersecting the first direction in a plan view. Each pixel 1 includes a first subpixel 11, a second subpixel 12, and a third subpixel 13. As shown in FIG. 1, all subpixels are arranged in an array along the first direction (e.g., a column direction) and the second direction (e.g., a row direction). The first subpixel 11, the second subpixel 12, and the third subpixel 13 in each pixel 1 are consecutively arranged along the first direction. All subpixels consecutively arranged along the second direction in a same row are of a same color from different pixels 1. For example, in the first row, a plurality of first subpixels 11 are consecutively arranged along the second direction; in the second row, a plurality of second subpixels 12 are consecutively arranged along the second direction; in the third row, a plurality of third subpixels 13 are consecutively arranged along the second direction. The curved display panel is curved along the second direction, e.g., the curvature direction is substantially parallel to the second direction. The curved display panel is not curved along the first direction. Thus, the first direction is substantially orthogonal to the curvature direction (e.g., the second direction) of the curved display panel. Two sides of the curved display panel (e.g., the left side and the right side) are not curved. These sides extend substantially along the first direction.

Figure 2:
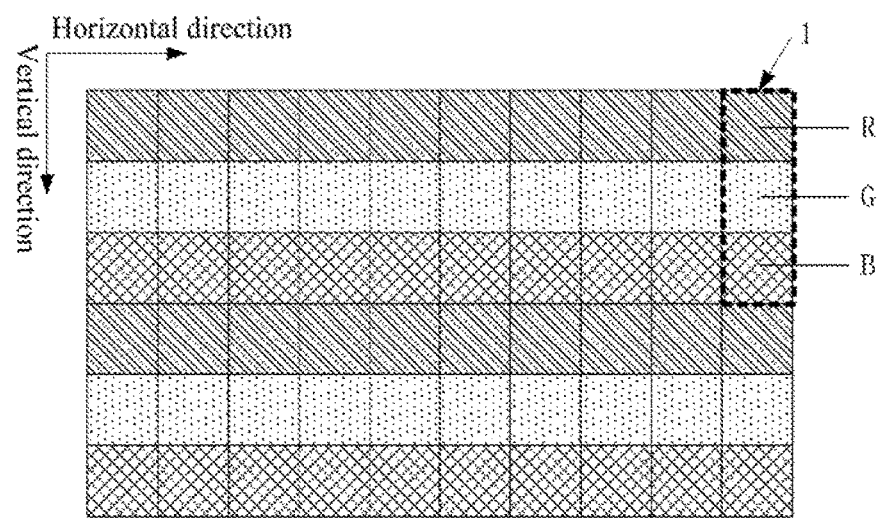
FIG. 2 is a top view o a curved display panel in some embodiments according to the present disclosure.

FIG. 2 is a top view of a curved display panel in some embodiments according to the present disclosure. Referring to FIG. 2, the curved display panel includes a plurality of pixels 1 arranged in an array along a vertical direction and a horizontal direction intersecting the vertical direction in a plan view. Each pixel 1 includes a red subpixel R, a green subpixel G, and a blue subpixel B. As shown in FIG. 2, all subpixels are arranged in an array along the vertical direction and the horizontal direction. The red subpixel R, the green subpixel G, and the blue subpixel B in each pixel 1 are consecutively arranged along the vertical direction. All subpixels consecutively arranged along the horizontal direction in a same row are of a same color from different pixels 1. For example, in the first row, a plurality of red subpixels R are consecutively arranged along the second direction; in the second row, a plurality of green subpixels G are consecutively arranged along the second direction; in the third row, a plurality of blue subpixels B are consecutively arranged along the second direction. The curved display panel is curved along the horizontal direction, e.g., the curvature direction is substantially parallel to the horizontal direction. The curved display panel is not curved along the vertical direction. Thus, the vertical direction is substantially orthogonal to the curvature direction (e.g., the horizontal direction) of the curved display panel. Two sides of the curved display panel (e.g., the left side and the right side) are not curved. These sides extend substantially along the vertical direction.

Optionally, the first direction is substantially orthogonal to the second direction.

In some embodiments, the first subpixel 11, the second subpixel 12, and the third subpixel 13 are respectively subpixels of three primary colors. Optionally, the first subpixel 11 is a red subpixel, the second subpixel 12 is a green subpixel, and the third subpixel 13 is a blue subpixel. Optionally, the first subpixel 11 is a cyan subpixel, the second subpixel 12 is a magenta subpixel and the third subpixel 13 is a yellow subpixel.

When the display panel is curved to achieve the curvature, the array substrate and the counter substrate may undergo shift relative to each other, resulting in misalignment of pixels between the array substrate and the counter substrate along the curvature direction (e.g., the second direction). In the present curved display panel, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if there is pixel misalignment between the array substrate and the counter substrate, the light emitted from a subpixel in the array substrate is always filtered through a color filter unit of a same color in the counter substrate. Thus, the color mixing issue can be obviated.

Figure 3A:
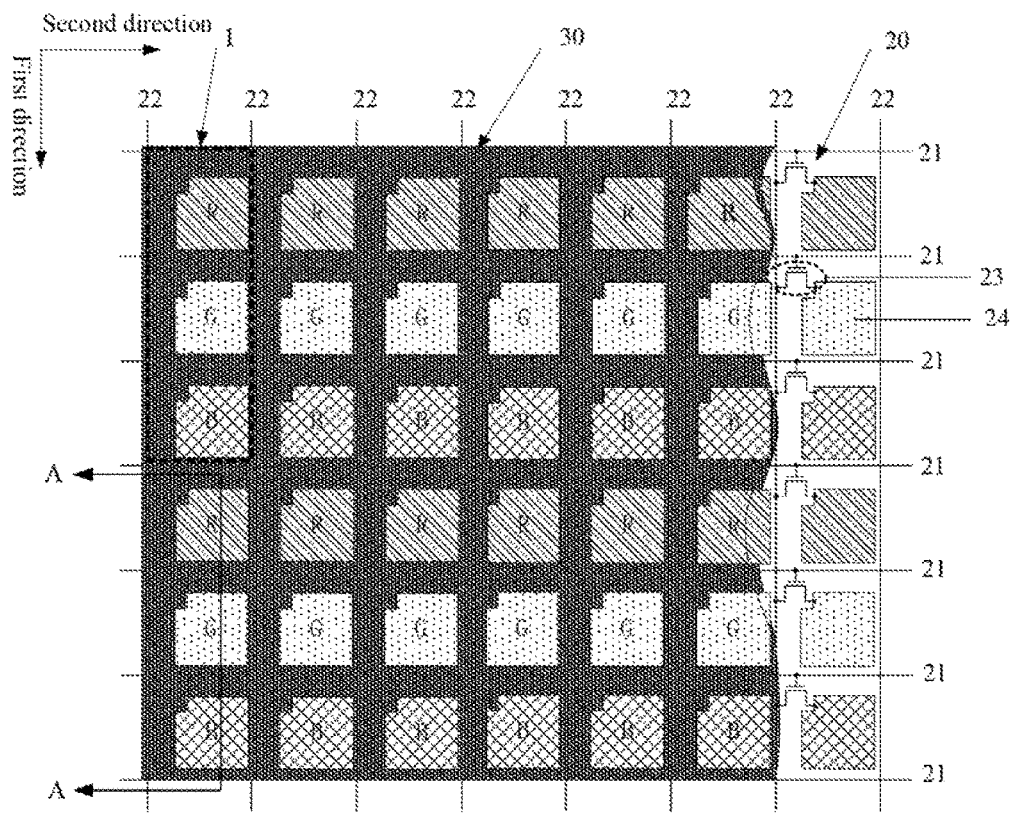
FIG. 3A is a top view of a curved liquid crystal display panel in some embodiments according to the present disclosure.
Figure 3B:
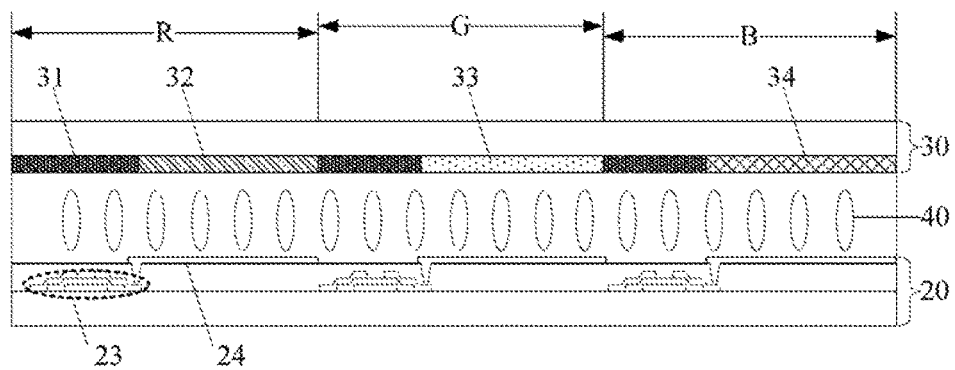
FIG. 3B is a cross-sectional view along A-A' line in FIG. 3A.

FIG. 3A is a top view of a curved liquid crystal display panel in some embodiments according to the present disclosure. FIG. 3B is a cross-sectional view along A-A' line in FIG. 3A. Referring to FIGS. 3A-3B, the curved liquid crystal display panel in some embodiments includes an array substrate 20, a color filter substrate 30, and a liquid crystal layer 40 between the array substrate 20 and the color filter substrate 30. The array substrate 20 includes a plurality of gate lines 21 and a plurality of data lines 22 crossing over each other, defining a plurality of subpixels in the array substrate 20. Each subpixel includes a switching transistor 23 and a pixel electrode layer 24. As shown in FIG. 3A, each of the plurality of gate lines 21 extends substantially along the second direction; and each of the plurality of data fines 22 extends substantially alone the first direction. Optionally, the switching transistor 23 includes a gate electrode coupled to the gate line 21, a gate insulating layer, a semiconductor active layer, a source electrode coupled to the data line 22, and a drain electrode coupled to the pixel electrode layer 24. Optionally, the switching transistor 23 is a thin film transistor. Optionally, the switching transistor 23 is a staggered transistor, an inverted staggered transistor, a co-planar transistor, or an inverted co-planar transistor.

In some embodiments, the color filter substrate 30 includes a plurality of color filter layers, e.g., a first color filter layer e.g., a red color filter layer), a second color filter layer (e.g., a green color falter layer), and a third color filter layer (e.g., a blue color filter layer). Each the plurality of color filter layers includes a plurality of color filter units of a same color. For example, the red color filter layer includes a plurality of color filter units 32, the green color filter layer includes a plurality of color filter units 33, and the blue color filter layer includes a plurality of color filter units 34. Each color filter unit corresponds to a subpixel in the array substrate, e.g., light emitted from each subpixel is filtered by a corresponding color filter unit. Optionally, adjacent color filter units are spaced apart by a black matrix layer 31. Optionally, the black matrix layer 31 is disposed in at least a portion of an inter-subpixel region between adjacent subpixels. The black matrix layer 31 covers the switching transistors 23 in subpixels of the curved display panel in plan view of the curved display panel.

In some embodiments, each of the plurality of pixels includes at least three color filter units of different colors, the at least three color filter units of different colors in a same pixel are consecutively arranged along the fast direction, and a plurality of color filter units consecutively arranged in a same row along the second direction are of a same color from different pixels. Optionally, the plurality of color filter layers of different colors include a color filter layer of a first color, a color filter layer of a second color, and a color filter layer of a third color. The color filter layer of the first color includes a plurality of rows of color filter units of the first color along the second direction, the color filter layer of the second color includes a plurality of rows of color filter units of the second color along the second direction, the color filter layer of the third color includes a plurality of rows of color filter units of the third color along the second direction, and each of the plurality of pixels includes one color filter unit of the first color, one color filter unit of the second color, and one color filter unit of the third color, consecutively along the first direction. Referring to FIGS. 3A-3B, each of the plurality of pixels 1 includes a red color filter unit 32, a green color filter unit 33, and a blue color filter unit 34. The red color filter unit 32, the green color filter unit 33, and the blue color filter unit 34 in a same pixel 1 are consecutively arranged along the first direction. The red color filter layer includes a plurality of rows of red color filter units 32 arranged along the second direction, the green color filter layer includes a plurality of rows of green color filter units 33 arranged along the second direction, and the blue color filter layer includes a plurality of rows of blue color filter units 34 arranged along the second direction. All color filter units consecutively arranged along the second direction in a same row are of a same color from different pixels 1. For example, in the first row, a plurality of red color filter units 32 are consecutively arranged along the second direction; in the second row, a plurality of green color filter units 33 are consecutively arranged along the second direction; in the third row, a plurality of blue color filter units 34 are consecutively arranged along the second direction. The curved liquid crystal display panel is curved along the second direction, e.g., the curvature direction is substantially parallel to the second direction.

In some embodiments, the array substrate 20 and the color filter substrate 30 are assembled together, and the subpixel areas of the array substrate 20 and the subpixel areas of the color filter substrate 30 are aligned to form a plurality of subpixels. For example, a red color filter unit 32 in the color filter substrate 30 corresponds to a red subpixel R in the assembled display panel, a green color filter unit 33 in the color filter substrate 30 corresponds to a green subpixel G in the assembled display panel, and a blue color filter unit 34 in the color filter substrate 30 corresponds to a blue subpixel B in the assembled display panel. Along the first direction, each pixel 1 includes a red subpixel R, a green subpixel G, and a blue subpixel B consecutively arranged along the first direction.

When the display panel is curved to achieve the curvature, the array substrate 20 and the color filter substrate 30 may undergo shift relative to each other, resulting in misalignment of pixels between the array substrate 20 and the color filter substrate 30 along the curvature direction (e.g., the second direction). In the present curved liquid crystal display panel, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if pixel misalignment between the array substrate 20 and the color filter substrate 30 occurs, the light emitted from a subpixel in the array substrate 20 is always filtered through a color filter unit of a same color in the color filter substrate 30. Thus, the color mixing issue can be obviated.

Figure 4A:
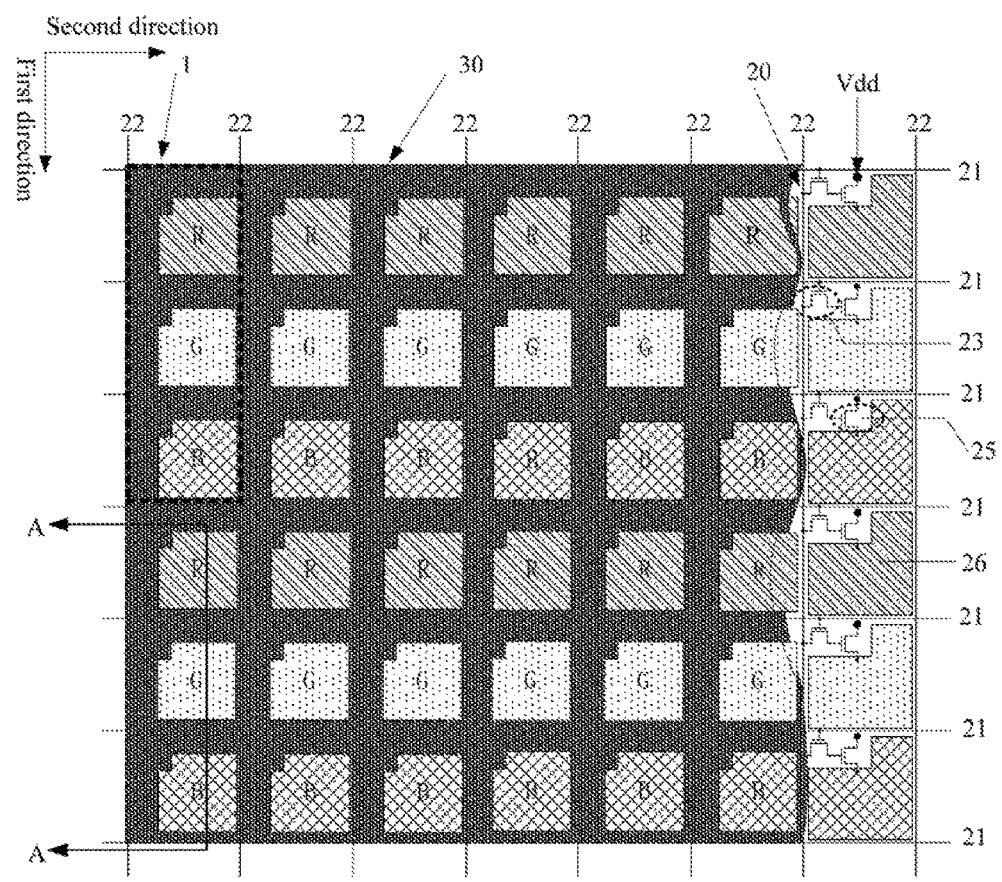
FIG. 4A is a top view of a curved organic light emitting display panel in some embodiments according to the present disclosure.
Figure 4B:
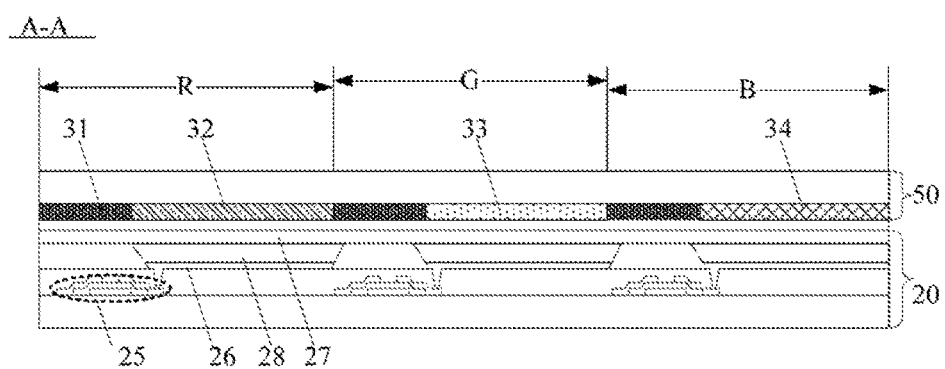
FIG. 4B is a cross-sectional view along A-A' line in FIG. 4A.

FIG. 4A is a top view of a curved organic light emitting display panel in some embodiments according to the present disclosure. FIG. 4B is a cross-sectional view along A-A' line in FIG. 4A. Referring to FIGS. 4A-4B, the curved organic light emitting display panel in some embodiments includes an array substrate 20 and an encapsulating substrate 50. The array substrate 20 includes a plurality of gate lines 21 and a plurality of data lines 22 crossing, over each other, defining a plurality of subpixels in the array substrate 20. Each subpixel includes a switching transistor 23, a driving transistor 25, an anode 26, a cathode 27, and one or more organic light functional layers 28 between the anode 26 and the cathode 27. As shown in FIG. 4A, each of the plurality of gate lines 21 extends substantially along the second direction; and each of the plurality of data lines 22 extends substantially along the first direction. Optionally, the switching transistor 23 includes a gate electrode coupled to the gate line 21, a gate insulating layer, a semiconductor active layer, a source electrode coupled to the data line 22, and a drain electrode coupled to the gate electrode of the driving transistor. Optionally, the driving transistor 25 includes a gate electrode coupled to the drain electrode of the switching transistor, a gate insulating layer, a semiconductor active layer, a source electrode coupled to a voltage source Vdd, and a drain electrode coupled to the anode 26. Optionally, the one or more organic light functional layers 28 include an electron transport layer, a hole transport layer, and an organic light emitting layer (e.g., a white light organic light emitting layer) between the electron transport layer and the hole transport layer. Optionally, the one or more organic light functional layers 28 further include an electron injection layer and a hole injection layer. Optionally, the switching transistor 23 is a thin film transistor. Optionally, the switching transistor 23 is a staggered transistor, an inverted staggered transistor, a co-planar transistor, or an inverted co-planar transistor. Optionally, the driving transistor 25 is a thin film transistor.

In some embodiments, the encapsulating substrate 50 includes a plurality of color filter layers, e.g., a first color filter layer (e.g., a red color filter layer), a second color filter layer (e.g., a green color filter layer), and a third color filter layer a blue color filter layer). Each the plurality of color filter layers includes a plurality of color filter units of a same color. For example, the red color filter layer includes a plurality of color filter units 32, the green color filter layer includes a plurality of color filter units 33, and the blue color filter layer includes a plurality of color filter units 34. Each color filter unit corresponds to a subpixel in the array substrate, e.g., light emitted from each subpixel is filtered by a corresponding color filter unit. Optionally, adjacent color filter units are spaced apart by a black matrix layer 31. Optionally, the black matrix layer 31 is disposed in at least a portion of an inter-subpixel region between adjacent subpixels. The black matrix layer 31 covers the transistors (including the switching transistors 23 and the driving transistors 25) in subpixels of the curved display panel in plan view of the curved display panel.

In some embodiments, each of the plurality of pixels includes at least three color filter units of different colors, the at least three color filter units of different colors in a same pixel are consecutively arranged along the first direction, and a plurality of color filter units consecutively arranged in a same row along the second direction are of a same color from different pixels. Optionally, the plurality of color filter layers of different colors include a color filter layer of a first color, a color filter layer of a second color, and a color filter layer of a third color. The color filter layer of a first color includes a plurality of rows of color filter units of a first color arranged along the second direction, the color filter layer of a second color includes a plurality of rows of color filter units of a second color arranged along the second direction, the color filter layer of a third color includes a plurality of rows of color filter units of a third color arranged along the second direction, and each of the plurality of pixels includes a color filter unit of a first color, a color filter unit of a second color, and a color filter unit of a third color, consecutively arranged along the first direction. Referring to FIGS. 4A-4B, each of the plurality of pixels 1 includes a red color filter unit 32, a green color filter unit 33, and a blue color filter unit 34. The red color filter unit 32, the green color filter unit 33, and the blue color filter unit 34 in a same pixel 1 are consecutively arranged along the first direction. The red color filter layer includes a plurality of rows of red color filter units 32 arranged along the second direction, the green color filter layer includes a plurality of rows of green color filter units 33 arranged along the second direction, and the blue color filter layer includes a plurality of rows of blue color filter units 34 arranged along the second direction. All color filter units consecutively arranged along the second direction in a same row are of a same color from different pixels 1. For example, in the first row, a plurality of red color filter units 32 are consecutively arranged along the second direction; in the second row, a plurality of green color filter units 33 are consecutively arranged along the second direction; in the third row, a plurality of blue color filter units 34 are consecutively arranged along the second direction. The curved organic light entitling display panel is curved along the second direction, e.g., the curvature direction is substantially parallel to the second direction.

In some embodiments, the array substrate 20 and the encapsulating substrate 50 are assembled together, and the subpixel areas of the array substrate 20 and the subpixel areas of the encapsulating substrate 50 are aligned to form a plurality of subpixels. For example, a red color filter unit 32 in the encapsulating substrate 50 corresponds to a red subpixel R in the assembled display panel, a green color filter unit 33 in the encapsulating substrate 50 corresponds to a green subpixel G in the assembled display panel, and a blue color filter unit 34 in the encapsulating substrate 50 corresponds to a blue subpixel B in the assembled display panel. Along the first direction, each pixel 1 includes a red subpixel R, a green subpixel G, and a blue subpixel B consecutively arranged along the first direction.

When the display panel is curved to achieve the curvature, the array substrate 20 and the encapsulating substrate 50 may undergo shift relative to each other, resulting in misalignment of pixels between the array substrate 20 and the encapsulating substrate 50 along the curvature direction (e.g., the second direction). In the present curved organic light emitting display panel, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if pixel misalignment between the array substrate 20 and the encapsulating substrate 50 occurs, the light emitted from a subpixel in the array substrate 20 is always filtered through a color filter unit of a same color in the encapsulating substrate 50. Thus, the color mixing issue can be obviated.

Optionally, the plurality of color filter layers are disposed in the counter substrate (e.g., a color filter substrate 30 in FIG. 3B and an encapsulating substrate 50 in FIG. 4B). Optionally, the plurality of color, filter layers are disposed in the array substrate 20.

Figure 5:
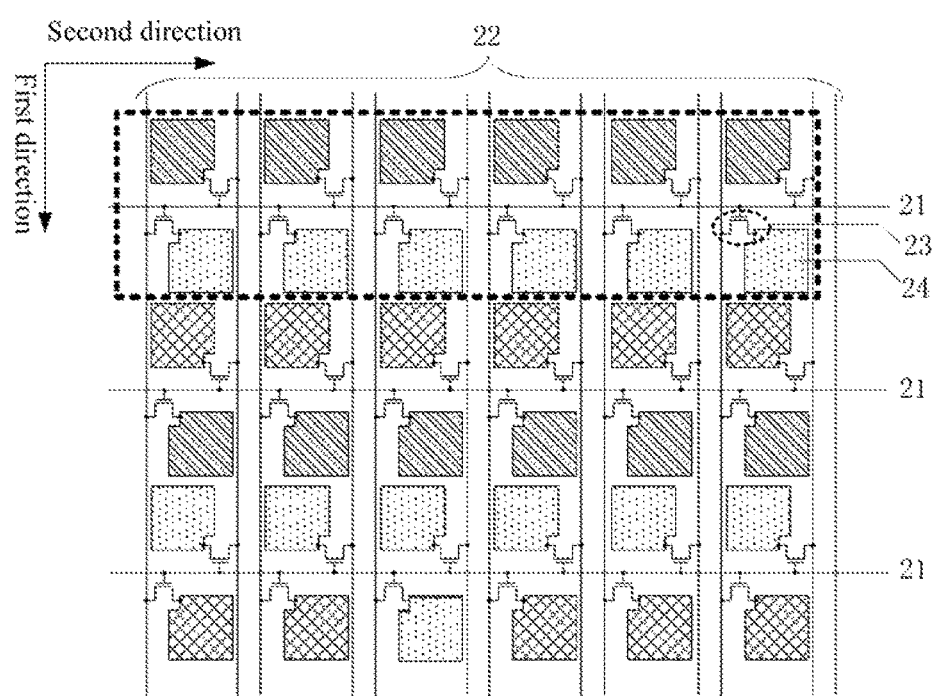
FIG. 5 is a top view of an array substrate of a curved display panel in some embodiments according to the present disclosure.
Figure 6:
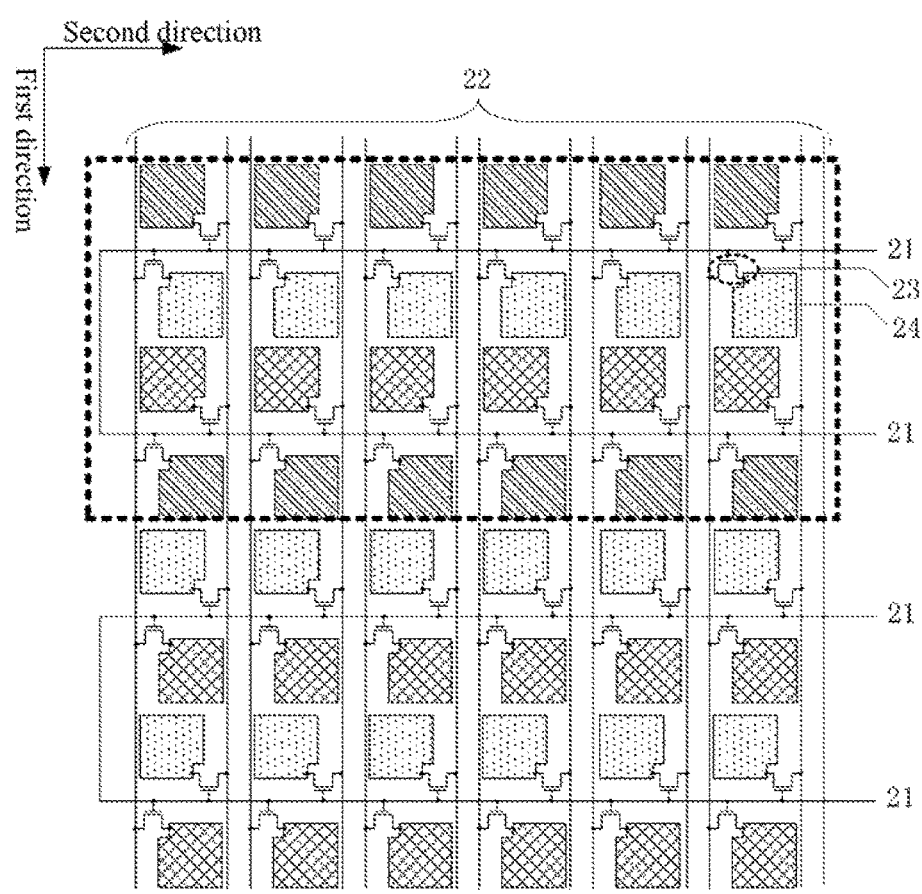
FIG. 6 is a top view of an array substrate of a curved display panel in some embodiments according to the present disclosure.

FIG. 5 is a top view of an array substrate of a curved display panel in some embodiments according to the present disclosure. FIG. 6 is a top view of an array substrate of a curved display panel in some embodiments according to the present disclosure. Referring to FIGS. 5-6, the curved display panel in some embodiments includes, along the first direction, a plurality of groups of rows of subpixels to group of rows of subpixels is shown in the dotted area of FIG. 5 or FIG. 6). Each of the plurality of groups of rows of subpixels includes at least two adjacent rows of subpixels. Subpixels in each of the at least two adjacent rows of subpixels are arranged along the second direction. Optionally, the plurality of gate lines 21 are configured to sequentially scan the plurality of groups of rows of subpixels group-by-group along the first direction in a plurality of scanning stages of a scanning cycle, each of the plurality of groups of rows of subpixels being scanned in a same scanning stage of the scanning cycle. The plurality of data lines 22 are configured to provide data signals to subpixels in the plurality of groups of rows of subpixels. In FIG. 5, each of the plurality of groups of rows of subpixels includes two adjacent rows of subpixels. In FIG. 6, each of the plurality of groups of rows of subpixels includes four adjacent rows of subpixels.

The plurality gate lines 21 and the plurality of data lines 22 are configured to sequentially drive image display in the plurality of groups of rows of subpixels group-by-group along the first direction. In some embodiments, in a first scanning stage of a scanning cycle, a scanning signal is provided to a first gate line 21 coupled to all switching transistors 23 in all subpixels of a first group of rows of subpixels, data signals are provided to a plurality of data lines 22 coupled to the pixel electrodes 24 in subpixels of the first group of rows of subpixels, thereby driving image display of the subpixels in the first group. In the next scanning stage of the scanning cycle, a scanning signal is provided to a second gate line 21 coupled to all switching transistors 23 in all subpixels of a second group of rows of subpixels, data signals are provided to a plurality of data lines 22 coupled to the pixel electrodes 24 in subpixels of the second group of rows of subpixels, thereby driving image display of the subpixels in the second group. The plurality gate lines 21 and the plurality of data lines 22 sequentially scan through a plurality of groups of rows of subpixels group-by-group along the first direction, thereby driving image display in the display panel.

The curved display panel may have various appropriate numbers or layouts of gate line 21 and data line 22 that permits the sequential driving of image display in the plurality of groups of rows of subpixels group-by-group along the first direction. In any implementation, all switching transistors 23 in one group of rows of subpixels are turned on by one or more gate lines 21 coupled to the switching transistors 23 in a same scanning stage of a scanning cycle. When the switching transistors 23 in the group of rows of subpixels are turned on, data signals transmitted from the data lines 22 are provided to the pixel electrodes 24 of the subpixels in the same group of rows of subpixels. Optionally, when the number of gate lines 21 coupled to the switching transistors 23 in a same group of rows of subpixels is two or more, ate two or more gate lines 21 may be coupled to each other.

By way of example, FIGS. 5-6 illustrate the plurality of groups of rows of subpixels in a curved liquid crystal display panel. Optionally, the curved display panel is a curved organic light emitting display panel having a plurality of groups of rows of subpixels. An implementation similar to that discussed in the context of the curved liquid crystal display panel may be achieved in the curved organic light emitting display panel.

By having a plurality of groups of rows of subpixels each including at least two adjacent rows of subpixels, subpixels in multiple rows may be scanned in a same scanning stage of a scanning cycle. By having this design, the charging time of the subpixels in each group may be increased, and the charging rate enhanced.

Referring to FIGS. 5-6, in some embodiments, each group, of the plurality of groups of rows of subpixels includes two adjacent rows of subpixels; each subpixel of the plurality of groups of rows of subpixels includes a switching transistor 23; each of the plurality of groups of rows of subpixels is associated with one of the plurality of gate lines 21, which is disposed between the two adjacent rows of subpixels of each group of the plurality of groups of rows of subpixels, and is coupled to each switching transistor 23 of each subpixel of the plurality of groups of rows of subpixels. Each two adjacent columns of subpixels of each of the plurality of groups of rows of subpixels is associated With two adjacent data lines 22 of the plurality of data lines 22, which are disposed between each two adjacent columns of subpixels of each of the plurality of groups of rows of subpixels. The two adjacent data lines 22 associated with each two adjacent columns of subpixels of each of the plurality of groups of rows of subpixels are respectively coupled to source electrodes of two switching transistors of two subpixels in different rows from each two adjacent columns subpixels. For example, the first adjacent data line 22 is coupled to a source electrode of a switching transistor in a subpixel in a first row and a first column from the two adjacent columns of subpixels the top row and the left column), and the second adjacent data line 22 is coupled to a source electrode of a switching transistor in a subpixel in a second row and a second column from the two adjacent columns of subpixels (e.g., the bottom row and the right column).

Accordingly, in some embodiments, all switching transistors 23 in all subpixels in a same group of two adjacent rows of subpixels may be turned on or off by one gate line 21. Moreover, by having a pair of two adjacent data lines 22 disposed between each two adjacent columns of subpixels in the group of two adjacent rows of subpixels, data signals may be provided to all subpixels in both adjacent rows of subpixels when the scanning signal is provided to the gate line 21. By having this design, the charging time of subpixels can be increased, and the total number of gate lines 21 in the display panel can be reduced. The gate lines 21 may be formed in a same patterning step as the gate electrodes, and the data lines 22 may be formed in a same patterning step as the source electrodes and the drain electrodes, no additional patterning steps are required.

In some embodiments, the curved display panel is an Advanced Super Dimensional Switching (ADS) type display panel. The ADS type display panel has the advantages of a high resolution, a high light transmission rate, lower power consumption, a wide view angle, a high aperture ratio, lower color shift, and no push mura.

Figure 7A:
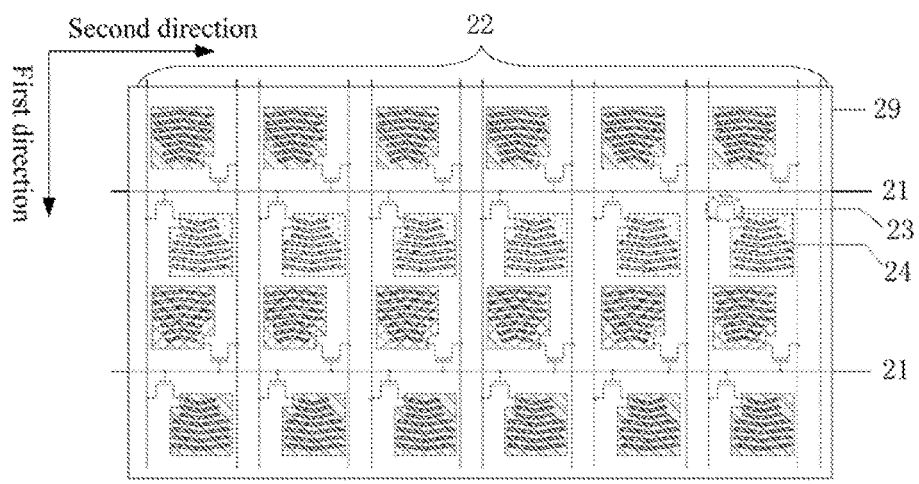
FIG. 7A is a top view of an array substrate of a curved liquid crystal display panel in some embodiments according to the present disclosure.

FIG. 7A is a top view of an array substrate of a curved liquid crystal display panel in some embodiments according to the present disclosure. Referring to FIG. 7A, the curved liquid crystal display panel in some embodiments is an ADS type display panel. In some embodiments, the array substrate 20 further includes a common electrode layer 29 in a layer different from that of the pixel electrode layer 24. The common electrode layer 29 substantially covers the plurality of data lines 22 in plan view of the curved display panel. For example, a projection of the plurality of data lines 22 on a base substrate of the array substrate 20 substantially overlaps with, and is within, that of the common electrode layer 29.

Typically, when assembling an array substrate and a counter substrate (e.g., a color filter substrate), a margin of approximately 9 μm is required in all dimensions, considering possible misalignment between the array substrate and the counter substrate. Thus, in conventional display panels, the black matrix layer is typically made relatively wider to compensate for misalignment and prevent light leakage due to the misalignment. A wider black matrix layer results in loss of aperture ratio.

In the curved display panel shown in FIG. 7A, the common electrode layer 29 covers the plurality of data lines 22 in plan view of the curved display panel, e.g., a projection of the plurality of data lines 22 on a base substrate of the array substrate 20 substantially overlaps with, and is within, that of the common electrode layer 29. The liquid crystal molecules above the data lines 22 and covered by the common electrode layer 29 may be controlled by a fringe electric field formed between the data lines 22 and the common electrode layer 29. The liquid crystal molecules in the liquid crystal layer in the inter-subpixel region between adjacent columns of subpixels (e.g., the region above the data lines 22 and covered by the common electrode layer 29) can be controlled to have a rotation angle corresponding to a normally black mode, for example, in an ADS type display panel. Thus, light leakage in the inter-subpixel region between adjacent columns of subpixels can be effectively prevented without a black matrix layer, resulting in a higher aperture ratio.

Figure 7B:
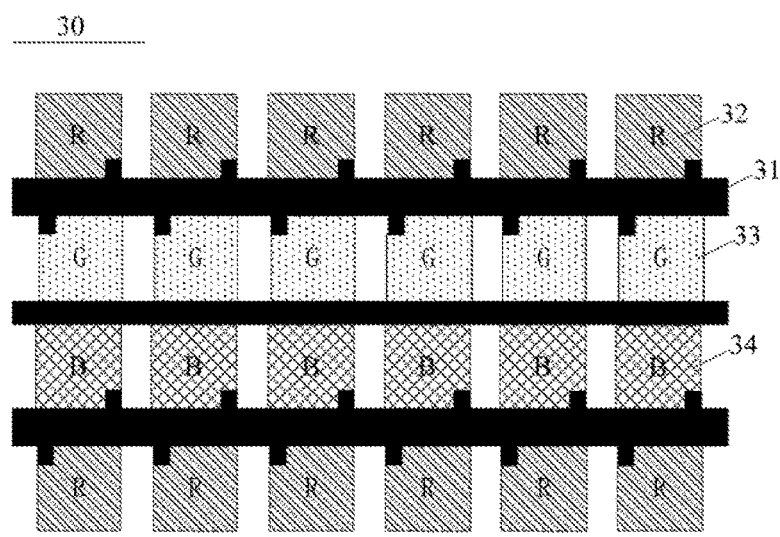
FIG. 7B is a top view of a color filter substrate of a curved liquid crystal display panel in some embodiments according to the present disclosure.

FIG. 7B is a top view of a color filter substrate of a curved liquid crystal display panel in some embodiments according to the present disclosure. Referring to FIG. 7B, the curved liquid crystal display panel includes a black matrix layer 31 (e.g., in the color filter substrate 30). The black matrix layer 31 is disposed between any two adjacent rows of subpixels, subpixels in each of the two adjacent rows of subpixels being arranged along the second direction. As shown in FIG. 7B, the black matrix layer 31 is absent in an inter-subpixel region between adjacent subpixels along the second direction (e.g., the row direction). By having this design, the aperture ratio of the curved display panel may be increased.

As used herein, an ante-subpixel region refers to a region between adjacent subpixel regions, such as a region corresponding to a black matrix in a liquid crystal display, or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

As used herein, a subpixel region refers to a light emission region of a subpixel, such as a region corresponding to a pixel electrode in a liquid crystal display, or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

Moreover, the black matrix layer 31 covers transistors in subpixels of the curved display panel in plan view of the curved display panel. Optionally, the subpixel of the curved display panel includes a switching transistor, and the black matrix layer 31 covers the switching transistors in subpixels of the curved display panel in plan view of the curved display panel. Optionally, the subpixel of the curved display panel includes a switching transistor and a driving transistor, and the black matrix layer 31 covers both the switching transistors and the driving transistors subpixels of the curved display panel in plan view of the curved display panel.

In some embodiments, the common electrode layer 29 is an integral layer. In some embodiments, the common electrode layer 29 is on a side of the pixel electrode layer 24 distal to a base substrate of the array substrate, and the common electrode layer 29 is patterned to have a plurality of branches (spaced apart by a plurality of slits) in regions corresponding to the subpixel region of each subpixel. In some embodiments, the pixel electrode layer 24 is on a side of the common electrode layer 29 distal to a base substrate of the array substrate, and the pixel electrode layer 24 is patterned to have a plurality of branches (spaced apart by a plurality of slits) in regions corresponding to the subpixel region of each subpixel.

Figure 8A:
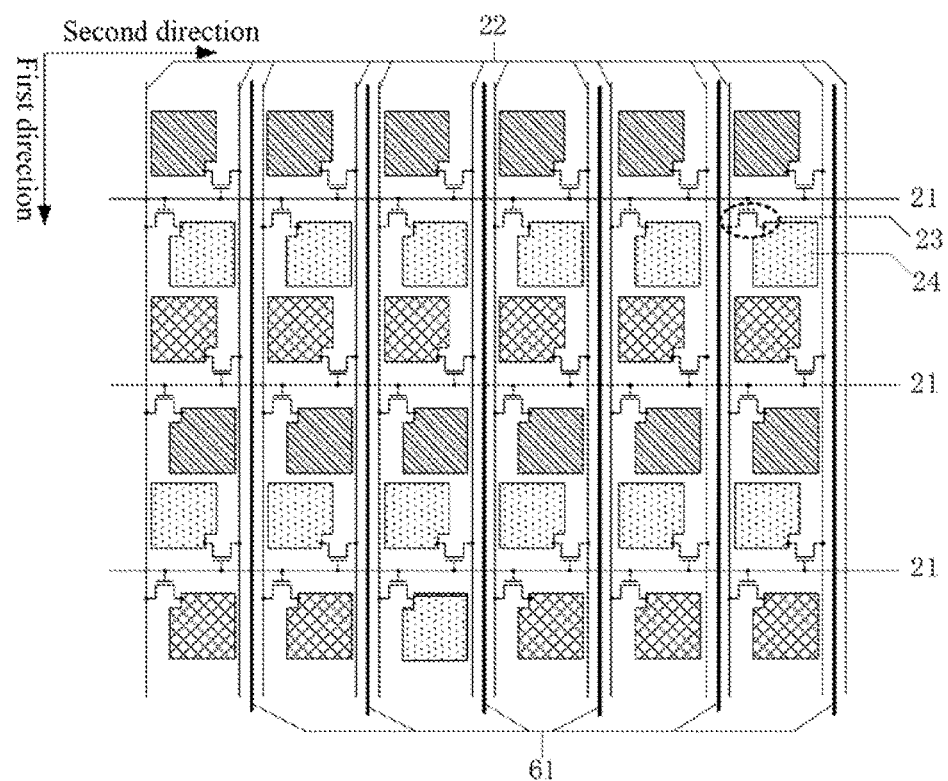
FIG. 8A is a top view of an array substrate of a curved liquid crystal display panel in some embodiments according to the present disclosure.
Figure 8B:
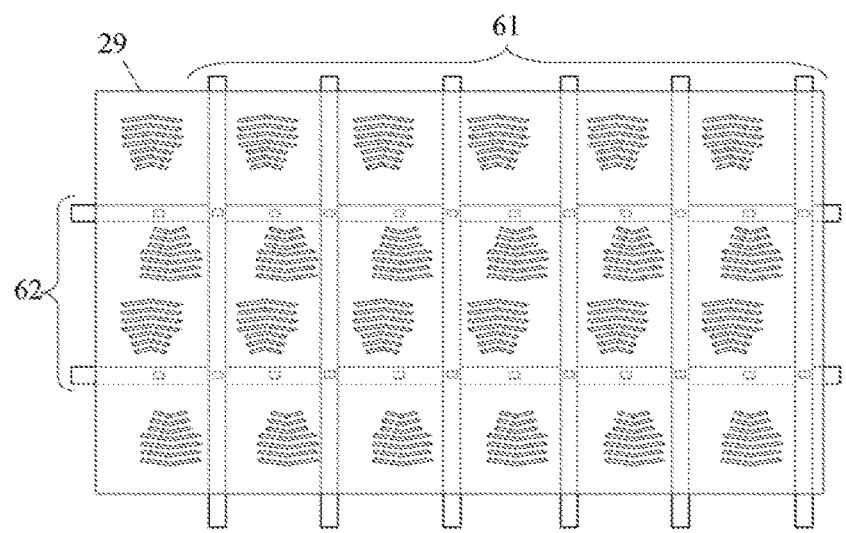
FIG. 8B illustrates an array substrate of a curved liquid crystal display panel having a plurality of common electrode lines and a plurality of auxiliary conductive lines coupled to a common electrode layer in some embodiments according to the present disclosure.

FIG. 8A is a top view of an array substrate of a curved liquid crystal display panel in some embodiments according to the present disclosure. FIG. 8B illustrates an array substrate of a curved liquid crystal display panel having a plurality of common electrode lines and a plurality of auxiliary conductive lines (e.g., a plurality of auxiliary metal lines) coupled to a common electrode layer in some embodiments according to the present disclosure. Referring to FIGS. 8A-8B, the array substrate 20 in some embodiments includes a pixel electrode layer 24, a common electrode layer 29, a plurality of common electrode lines 62 coupled to the common electrode layer 29 and substantially, parallel to the plurality of gate lines 21, and a plurality of auxiliary conductive lines 61 (e.g., a plurality of auxiliary metal lines) coupled to the common electrode layer 29 and substantially parallel to the plurality of data lines 22. The common electrode lines 62 may form storage capacitance with the pixel electrode layer 24.

The plurality of auxiliary conductive lines 61 may be coupled to the common electrode layer 29 through a plurality of vias (shown as small squares in FIG. 8B).

By having both a plurality of auxiliary conductive lines 61 and a plurality of common electrode lines 62 in the curved display panel (e.g., in the array substrate 20), a network of conductive lines (e.g., a network of conductive metal lines) is formed in the curved display panel. The network of conductive lines is coupled to the common electrode layer 29. By having this design, an improved resistance uniformity of the common electrode layer 29 can be achieved. Various issues caused by resistance non-uniformity, such as green color shift and flicker, can be obviated.

Referring to FIG. 8A, in some embodiments, each of the plurality of auxiliary conductive lines 61 is disposed between the two adjacent data lines 22 disposed between each two adjacent columns of subpixels of each of the plurality of groups of rows of subpixels. Optionally, the plurality of auxiliary conductive lines 61 and the plurality of data lines 22 are in a same layer. Optionally, the plurality of gate lines 21 and the plurality of common electrode lines 62 are in a same layer.

As used herein, the term "same layer" refers to the relationship between the layers simultaneously formed in the same step. In one example, two metal lines are on the same layer when the two metal lines are formed as a result of one or more steps of a same patterning process performed on a same layer of material. In another example, the auxiliary conductive lines 61 and the data lines 22 can be formed in the same layer by simultaneously performing the step of forming the auxiliary conductive lines 61 and the step of forming the data lines 22. The term "same layer" does not always mean that the thickness of the layer or the height of the layer in a cross-sectional view is the same.

In some embodiments, the curved display panel is a curved organic light emitting diode display panel. Optionally, the plurality of color filter layers of different colors are disposed in an encapsulating substrate facing the array substrate, and the array substrate further includes an anode layer, a cathode layer, and an organic light emitting layer between the anode layer and the cathode layer, the organic light emitting layer being a white light, emitting layer. Optionally, the encapsulating substrate further includes a black matrix layer disposed between any two adjacent rows of subpixels, subpixels in each of the two adjacent rows of subpixels being arranged along the second direction. Optionally, the black matrix layer is absent in an intersubpixel region between adjacent subpixels along the second direction. Optionally, the black matrix layer covers transistors in subpixels of the curved display panel in plan view of the curved display panel.

Figure 9A:
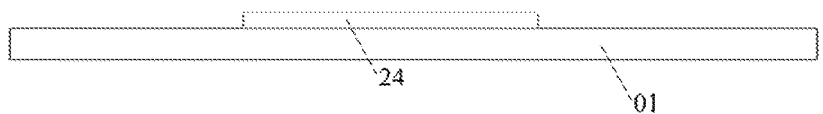
FIGS. 9A-9D illustrate a process of Imbricating a curved display panel in some embodiments according to the present disclosure.

In another aspect, the present invention provides a method of fabricating a curved display panel. FIGS. 9A-9D illustrate a process of fabricating a curved display panel in some embodiments according to the present disclosure. Referring to FIG. 9A, the fabricating process in some embodiments first includes forming a pixel electrode layer 24 on a base substrate 01 in a subpixel region of each subpixel, e.g., in one or more patterning process. Optionally, the pixel electrode layer 24 is made of indium tin oxide.

Figure 9B:
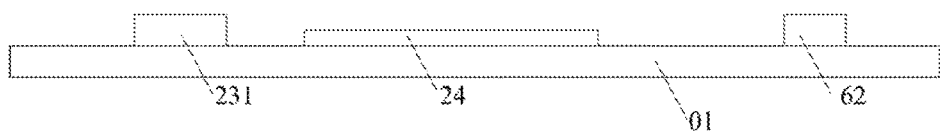

Referring to FIG. 9B, the fabricating process in some embodiments further includes forming a gate electrode 231, a gate line, and a common electrode line 62 in a single process, e.g., in a single patterning process, on a side of the pixel electrode layer 24 distal to the base substrate 01. Optionally, the single layer including the gate electrode 231, the gate line, and the common electrode line 62 has a laminated three sub-layer structure. Optionally, the laminated three-sublayer structure includes a first metal sub-layer including molybdenum, a second metal sub-layer including aluminum, and a third metal sub-layer including molybdenum.

Figure 9C:
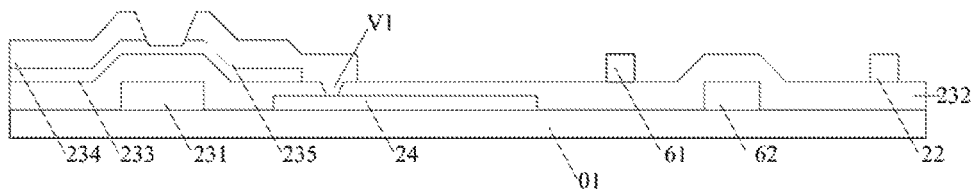

Referring to FIG. 9C, the fabricating process in some embodiments further includes forming a gate insulating layer 232 on a side of the gate electrode 231, the gate line, and the common electrode line 62 distal to the base substrate 01; and forming a first via VI in the gate insulating layer 232 exposing a portion of the pixel electrode layer 24. Optionally, the gate insulating layer 232 is made of silicon oxide ($SiO_x$) or silicon nitride ($SiN_x$), or a combination of silicon oxide and silicon nitride. The fabricating process further includes forming a semiconductor active layer 233 on a side of the gate insulating layer 232 distal to the gate electrode 231; and forming a source electrode 234, a drain electrode 235, and one or more data line 22, and an auxiliary metal line 61 in a single process, e.g., in a single patterning process, on a side of the active layer 233 and the gate insulating layer 232 distal to the base substrate 01. The drain electrode 235 is electrically connected to the pixel electrode layer 24 through the first via V1 in the gate insulating layer 232. Optionally, the semiconductor active layer 233 includes an amorphous silicon sub-layer and an ohmic contact sub-layer. Optionally, the single layer including the source electrode 234, the drain electrode 235, the one or more data line 22, and the auxiliary metal line 61 has a laminated three sub-layer structure. Optionally, the laminated three-sublayer structure includes a first metal sub-layer including molybdenum, a second metal sub-layer including aluminum, and a third metal sub-layer including molybdenum.

Figure 9D:
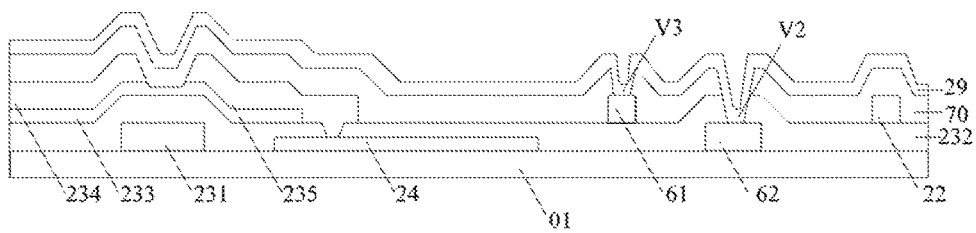

Referring to FIG. 9D, the fabricating process in some embodiments further includes forming a passivation layer 70 on a side of the single layer including the source electrode 234, the drain electrode 235, the one or more data line 22, and the auxiliary metal line 61 distal to the base substrate 01; and forming a second via V2 in the passivation layer 70 exposing a portion of the common electrode line 62 and a third via V3 in the passivation layer 70 exposing a portion of the auxiliary metal line 61. The fabricating process further includes forming a common electrode layer 29 on a side of the passivation layer 70 distal to the base substrate 01. The common electrode layer 29 is electrically connected to the common electrode line 62 through the second via V2 and electrically connected to the auxiliary metal line 61 through the third via V3. The common electrode layer 29 is patterned to have a plurality of branches (spaced apart by a plurality of slits) in regions corresponding to the subpixel region of each subpixel.

In some embodiments, the method of fabricating a curved display panel includes forming a display panel having a plurality of pixels arranged in an array along a first direction and a second direction intersecting the first direction in a plan view; and curving the display panel along a curvature direction, the curvature direction being substantially parallel to the second direction. Optionally, each of the plurality of pixels is formed to include at least three subpixels of different colors; the at least three subpixels in a same pixel are formed to be consecutively arranged along the first direction; and a plurality of subpixels consecutively arranged along the second direction in a same row are formed to be of a same color from different pixels.

In some embodiments, the step of forming the display panel includes forming an array substrate having a plurality of gate lines and a plurality of data lines. Optionally, each of the plurality of gate lines is formed to extend substantially along the second direction. Optionally, each of the plurality of data lines is (brined to extend substantially along the first direction.

In some embodiments, the method includes forming a plurality of groups of rows of subpixels along the first direction. Each of the plurality of groups of rows of subpixels is formed to include at least two adjacent rows of subpixels. Subpixels in each of the at least two adjacent rows of subpixels are formed to be arranged along the second direction. In a curved display panel fabricated by the present method, the plurality of gate lines are configured to sequentially scan the plurality of groups of rows of subpixels group-by-group along the first direction in a plurality of seaming stages of a scanning cycle, each of the plurality of groups of rows of subpixels being scanned in a same scanning stage of the scanning cycle.

In some embodiments, each of the plurality of groups of rows of subpixels is formed to include two adjacent rows of subpixels. Each subpixel of the plurality of groups of rows of subpixels is formed to include a switching transistor. Each of the plurality of groups of rows of subpixels is formed to be associated with one of the plurality of gate lines, which is disposed between the two adjacent rows of subpixels of each of the plurality of groups of rows of subpixels, and is coupled to each switching transistor of each subpixel of the plurality of groups of rows of subpixels. Each two adjacent columns of subpixels of each of the plurality of groups of rows of subpixels is formed to be associated with two adjacent data lines of the plurality of data lines, which are disposed between each two adjacent columns of subpixels of each of the plurality of groups of rows of subpixels. The two adjacent data lines associated with each two adjacent columns of subpixels of each of the plurality of groups of rows of subpixels are respectively coupled to source electrodes of two switching transistors of two subpixels in different rows from each two adjacent columns of subpixels.

In some embodiments, the method further includes Miming a plurality of color filter layers of different colors; each of the plurality of color filter layers is formed to include a plurality of color filter units of a same color. Optionally, each of the plurality of pixels is formed to include at least three color filter units of different colors, the at least three color filter units of different colors in a same pixel are formed to be consecutively arranged along the first direction, and a plurality of color filter units consecutively arranged in a same row along the second direction are of a same color from different pixels.

In some embodiments, the plurality of color filter layers of different colors are formed to include a color filter layer of a first color, a color filter layer of a second color, and a color filter layer of a third color. The color filter layer of a first color is formed to include a plurality of rows of color filter units of a first color arranged along the second direction, the color filter layer of a second color is formed to include a plurality of rows of color filter units of a second color arranged along the second direction, and the color filter layer of a third color is formed to include a plurality of rows of color filter units of a third color arranged along the second direction. Each of the plurality of pixels is formed to include a color filter unit of a first color, a color filter unit of a second color, and a color filter unit of a third color, consecutively arranged along the first direction.

In some embodiments, the curved display panel is a curved liquid crystal display panel. Optionally, the plurality of color filter layers of different colors are formed in a color filter substrate facing the array substrate. Optionally, the method further includes forming a black matrix in the color filter substrate, and the black matrix layer is formed between any two adjacent rows of subpixels, subpixels in each of the two adjacent rows of subpixels formed to be arranged along the second direction. The black matrix layer is absent in an inter-subpixel region between adjacent subpixels along the second direction. Optionally, the method further includes forming a pixel electrode layer and a common electrode layer in the array substrate, the pixel electrode layer and the common electrode layer being formed in two different layers, e.g., in two different patterning steps. Optionally, the common electrode layer is formed to cover the plurality of data lines in plan view of the curved display panel. Optionally, the black matrix layer is formed to cover transistors in subpixels of the curved display panel in plan view of the curved display panel.

In some embodiments, the method includes forming a pixel electrode layer, a common electrode layer, a plurality of common electrode lines, and a plurality of auxiliary conductive lines (e.g., a plurality of auxiliary metal lines), for example, in an array substrate. Optionally, the plurality of common electrode lines are formed to be coupled to the common electrode layer and substantially parallel to the plurality of gate lines. Optionally, the plurality of auxiliary conductive lines are formed to be coupled to the common electrode layer and substantially parallel to the plurality of data lines.

In some embodiments, the plurality of gate lines and the plurality of common electrode lines are formed in a same layer, e.g., in a single patterning step, and the plurality of data lines and the plurality of auxiliary conductive lines are formed in a same layer, e.g., in a single patterning step.

In some embodiments, the method includes forming a pixel electrode layer, a common electrode layer, a plurality of common electrode lines, and a plurality of auxiliary conductive lines (e.g., a plurality of auxiliary metal lines), for example, in an array substrate. Optionally, the plurality of common electrode lines are formed to be coupled to the common electrode layer and substantially parallel to the plurality of gate lines. Optionally, the plurality of auxiliary conductive lines are formed to be coupled to the common electrode layer and substantially parallel to the plurality of data lines. Optionally, each of the plurality of auxiliary conductive lines is formed between the two adjacent data lines disposed between each two adjacent columns of subpixels of each of the plurality of groups of rows of subpixels. Optionally, the plurality of auxiliary conductive lines and the plurality of data lines are formed in a same layer, e.g., in a single patterning step.

In some embodiments, the curved display panel is a curved organic light emitting diode display panel. Optionally, the plurality of color filter layers of different colors are formed in an encapsulating substrate facing the array substrate. Optionally, the step of forming the array substrate includes forming an anode layer, forming a cathode layer, and forming an organic light emitting layer between the anode layer and the cathode layer. Optionally, the organic light emitting layer is a white light emitting layer. Optionally, the method further includes forming a black matrix in the encapsulating substrate, and the black matrix layer is formed between any two adjacent rows of subpixels, subpixels in each of the two adjacent rows of subpixels formed to be arranged along the second direction. The black matrix layer is absent in an inter-subpixel region between adjacent subpixels along the second direction. Optionally, the black matrix layer is formed to cover transistors in subpixels of the curved display panel in plan view of the curved display panel.

In a curved display panel fabricated according to the present method, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if there is pixel misalignment between the array substrate and the counter substrate, the light emitted from a subpixel in the array substrate is always filtered through a color filter unit of a same color in the counter substrate. Thus, the color mixing issue can be obviated.

In one example, the curved display panel is a curved liquid crystal display panel, e.g., the curved liquid crystal display panel is one shown in FIGS. 3A-3B. Referring to FIGS. 3A-3B, the method in some embodiments includes forming an array substrate 20 and a color filter substrate 30. The step of forming the array substrate 20 in some embodiments includes forming a plurality of gate lines 21 and a plurality of data lines 22 on a first base substrate. The plurality of gate lines 21 and a plurality of data lines 22 are formed to cross over each other, defining a plurality of subpixels in the array substrate 20. Each of the plurality of gate lines 21 is formed to extend substantially along the second direction, and each of the plurality of data lines is formed to extend substantially along the first direction. The step of forming the array substrate further includes forming a switching transistor 23 and a pixel electrode layer 24 in each subpixel. Optionally, the step of forming the switching transistor 23 includes forming a gate electrode coupled to the gate line 21, forming a gate insulating layer, forming a semiconductor active layer, forming a source electrode coupled to the data line 22, and forming a drain electrode coupled to the pixel electrode layer 24.

The step of forming the color filter substrate 30 in some embodiments includes forming a plurality of color filter layers on a second base substrate, e.g., forming a first color filter layer (e.g., a red color filter layer), forming a second color filter layer (e.g., a green color filter layer), and forming a third color filter layer (e.g., a blue color filter layer). Each of the plurality of color filter layers is formed to include a plurality of color filter units of a same color. For example, the red color filter layer is formed to include a plurality of color filter units 32, the green color filter layer is formed to include a plurality of color filter units 33, and the blue color filter layer is formed to include a plurality of color filter units 34. Each color filter unit corresponds to a subpixel in the array substrate, e.g., light emitted from each subpixel is filtered by a corresponding color filter unit. Optionally, the step of forming the color filter substrate 30 further includes forming a black matrix layer 31, adjacent color filter units are spaced apart by a black matrix layer 31. Optionally, the black matrix layer 31 is formed in at least a portion of an inter-subpixel region between adjacent subpixels. The black matrix layer 31 is formed to cover the switching transistors 23 in subpixels of the curved display panel in plan view of the curved display panel. In some embodiments, each of the plurality of pixels is formed to include at least three color filter units of different colors, the at least three color filter units of different colors in a same pixel are formed to be consecutively arranged along the first direction, and a plurality of color filter units consecutively arranged in a same row along the second direction are of a same color from different pixels. The curved liquid crystal display panel is curved along the second direction, e.g., the curvature direction is substantially parallel to the second direction.

In some embodiments, the array substrate 20 and the color filter substrate 30 are assembled together, and the subpixel areas of the array substrate 20 and the subpixel areas of the color filter substrate 30 are aligned to form a plurality of subpixels. For example, a red color filter unit 32 in the color filter substrate 30 corresponds to a red subpixel R in the assembled display panel, a green color filter unit 33 in the color filter substrate 30 corresponds to a green subpixel G in the assembled display panel, and a blue color filter unit 34 in the color filter substrate 30 corresponds to a blue subpixel B in the assembled display panel. Along the first direction, each pixel 1 includes a red subpixel R, a green subpixel G, and a blue subpixel B consecutively arranged along the first direction.

When the display panel is curved to achieve the curvature, the array substrate 20 and the color filter substrate 30 may undergo shift relative to each other, resulting in misalignment of pixels between the array substrate 20 and the color filter substrate 30 along the curvature direction (e.g., the second direction). In the present curved liquid crystal display panel, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if pixel misalignment between the array substrate 20 and the color filter substrate 30 occurs, the light emitted from a subpixel in the array substrate 20 is always filtered through a color filter unit of a same color in the color filter substrate 30. Thus, the color mixing issue can be obviated.

In another example, the curved display panel is a curved organic light emitting display panel, e.g., the curved organic light emitting display panel is one shown in FIGS. 4A-4B. Referring to FIGS. 4A-4B, the method in some embodiments includes forming an array substrate 20 and forming an encapsulating substrate 50. The step of forming the array substrate 20 in some embodiments includes forming a plurality of gate lines 21 and a plurality of data lines 22 on a first base substrate. The plurality of gate lines 21 and a plurality of data lines 22 are formed to cross over each other, defining a plurality of subpixels in the array substrate 20. Each of the plurality of gate lines 21 is formed to extend substantially along the second direction, and each of the plurality of data lines is formed to extend substantially along the first direction. The step of forming the array substrate further includes forming a switching transistor 23, forming a driving transistor 25, forming an anode 26, forming a cathode 27, and filming one or more organic light functional layers 28 between the anode 26 and the cathode 27. Optionally, the step of forming the switching transistor 23 includes forming a gate electrode coupled to the gate line 21, forming a gate insulating layer, forming a semiconductor active layer, forming a source electrode coupled to the data line 22, and forming a drain electrode coupled to the gate electrode of the driving transistor. Optionally, the step of forming the driving transistor 25 includes forming a gate electrode coupled to the drain electrode of the switching transistor, forming a gate insulating layer, forming a semiconductor active layer, forming a source electrode coupled to a voltage source Vdd, and forming a drain electrode coupled to the anode 26. Optionally, the step of forming the one or more organic light functional layers 28 include forming an electron transport layer, forming a hole transport layer, and forming an organic light emitting layer (e.g., a white light organic light emitting layer) between the electron transport layer and the hole transport layer. Optionally, the step of forming the one or more organic light functional layers 28 further include the step of forming an electron injection layer and the step of forming a hole injection layer.

In some embodiments, the step of forming the encapsulating substrate 50 includes forming a plurality of color filter layers on a second base substrate, e.g., forming a first color filter layer (e.g., a red color filter layer), forming a second color filter layer (e.g., a green color filter layer), and forming a third color filter layer (e.g., a blue color filter layer). Each the plurality of color filter layers is formed to include a plurality of color filter units of a same color. For example, the red color filter layer is formed to include a plurality of color filter units 32, the green color filter layer is formed to include a plurality of color filter units 33, and the blue color filter layer is formed to include a plurality of color filter units 34. Each color filter unit corresponds to a subpixel in the array substrate, e.g., light emitted from each subpixel is filtered by a corresponding color filter unit. Optionally, the step of forming the encapsulating substrate 50 further includes forming a black matrix layer 31, adjacent color filter units are formed to be spaced apart by a black matrix layer 31. Optionally, the black matrix layer 31 is formed in at least a portion of an inter-subpixel region between adjacent subpixels. The black matrix layer 31 is formed to cover the transistors (including the switching transistors 23 and the driving transistors 25) in subpixels of the curved display panel in plan view of the curved display panel. In some embodiments, each of the plurality of pixels is formed to include at least three color filter units of different colors, the at least three color filter units of different colors in a same pixel are formed to be consecutively arranged along the first direction, and a plurality of color filter units consecutively arranged in a same row alone the second direction are of a same color from different pixels. The curved organic light emitting display panel is curved along the second direction, e.g., the curvature direction is substantially parallel to the second direction.

In some embodiments, the array substrate 20 and the encapsulating substrate 50 are assembled together, and the subpixel areas of the array substrate 20 and the subpixel areas of the encapsulating substrate 50 are aligned to form a plurality of subpixels. For example, a red color fiber unit 32 in the encapsulating substrate 50 corresponds to a red subpixel R in the assembled display panel, a green color filter unit 33 in the encapsulating substrate 50 corresponds to a green subpixel G in the assembled display panel, and a blue color filter unit 34 in the encapsulating substrate 50 corresponds to a blue subpixel B in the assembled display panel. Along the first direction, each pixel 1 includes a red subpixel R, a green subpixel G, and a blue subpixel B consecutively arranged along the first direction.

When the display panel is curved to achieve the curvature, the array substrate 20 and the encapsulating substrate 50 may undergo shift relative to each other, resulting in misalignment of pixels between the array substrate 20 and the encapsulating substrate 50 along the curvature direction (e.g., the second direction). In the present curved organic light emitting display panel, subpixels in a same pixel are consecutively arranged along the first direction, subpixels consecutively arranged along the second direction in a same row are of a same color from different pixels, and a display surface of the curved display panel is curved along a curvature direction substantially parallel to the second direction. Due to the subpixel arrangement of the present curved display panel, even if pixel misalignment between the array substrate 20 and the encapsulating substrate 50 occurs, the light emitted from a subpixel in the array substrate 20 is always filtered through a color filter unit of a same color in the encapsulating substrate 50. Thus, the color mixing issue can be obviated.

In another example, the curved display panel is a curved display panel as shown in FIGS. 5-6. Referring to FIGS. 5-6, the step of forming the array substrate includes forming a plurality of groups of rows of subpixels, each group of the plurality of groups of rows of subpixels is formed to include two adjacent rows of subpixels; each subpixel of the plurality of groups of rows of subpixels is formed to include a switching transistor 23; each of the plurality of groups of rows of subpixels is formed to be associated with one of the plurality of gate lines 21, which is disposed between the two adjacent rows of subpixels of each group of the plurality of groups of rows of subpixels, and is coupled to each switching transistor 23 of each subpixel of the plurality of groups of rows of subpixels. Each two adjacent columns of subpixels of each of the plurality of groups of rows of subpixels is formed to be associated with two adjacent data lines 22 of the plurality of data lines 22, which are disposed between each two adjacent columns of subpixels of each of the plurality of groups of rows of subpixels. The two adjacent data lines 22 associated with each two adjacent columns of subpixels of each of the plurality of groups of rows of subpixels are formed to be respectively coupled to source electrodes of two switching transistors of two subpixels in different rows from each two adjacent columns of subpixels.

Accordingly, in a curved display panel fabricated by a method in some embodiments, all switching transistors 23 in all subpixels in a same group of two adjacent rows of subpixels may be turned on or off by one gate line 21. Moreover, by having a pair of two adjacent data lines 22 formed between each two adjacent columns of subpixels in the group of two adjacent rows of subpixels, data signals may be provided to all subpixels in both adjacent rows of subpixels when the scanning signal is provided to the gate line 21. By having this design, the charging time of subpixels can be increased, and the total number of gate lines 21 in the display panel can be reduced. The gate lines 21 may be formed in a same patterning step as the gate electrodes, and the data lines 22 may be formed in a same patterning step as the source electrodes and the drain electrodes, no additional patterning steps are required.

In some embodiments, the curved display panel is an Advanced Super Dimensional Switching (ADS) type display panel. The ADS type display panel has the advantages of a high resolution, a high light transmission rate, lower power consumption, a wide view angle, a high aperture ratio, lower color shift, and no push mura.

In another example, the curved display panel is a curved ADS type display panel as shown in FIGS. 7A-7B. Referring to FIGS. 7A-7B, the step of forming the array substrate includes forming a common electrode layer 29 in a layer different from that of the pixel electrode layer 24. The common electrode layer 29 is formed to cover the plurality of data lines 22 in plan view of the curved display panel.

In a curved display panel fabricated by the present method in some embodiments (e.g., the one shown in FIG. 7A), the common electrode layer 29 is formed to cover the plurality of data lines 22 in plan view of the curved display panel. The liquid crystal molecules above the data lines 22 and covered by the common electrode layer 29 may be controlled by a fringe electric field formed between the data lines 22 and the common electrode layer 29. The liquid crystal molecules in the liquid crystal layer in the inter-subpixel region between adjacent columns of subpixels (e.g., the region above the data lines 22 and covered by the common electrode layer 29) can be controlled to have a rotation angle corresponding to a normally black mode, for example, in an ADS type display panel. Thus, light leakage in the inter-subpixel region between adjacent columns of subpixels can be effectively prevented without a black matrix layer, resulting in a higher aperture ratio.

The black matrix layer 31 is formed to cover transistors in subpixels of the curved display panel in plan view of the curved display panel. Optionally, the subpixel of the curved display panel includes a switching transistor, and the black matrix layer 31 is formed to cover the switching transistors in subpixels of the curved display panel in plan view of the curved display panel. Optionally, the subpixel of the curved display panel includes a switching transistor and a driving transistor, and the black matrix layer 31 is formed to cover both the switching transistors and the driving transistors subpixels oldie curved display panel in plan view of the curved display panel.

In some embodiments, the common electrode layer 29 is formed as an integral layer. In some embodiments, the common electrode layer 29 is formed on a side of the pixel electrode layer 24 distal to a base substrate of the array substrate, and the common electrode layer 29 is patterned to have a plurality of branches (spaced apart by a plurality of slits) in regions corresponding to the subpixel region of each subpixel. In some embodiments, the pixel electrode layer 24 is formed on a side of the common electrode layer 29 distal to a base substrate of the array substrate, and the pixel electrode layer 24 is patterned to have a plurality of branches (spaced apart by a plurality of slits) in regions corresponding to the subpixel region of each subpixel.

In another example, the curved display panel is a curved liquid crystal display panel as shown in FIGS. 8A-8B. Referring to FIGS. 8A-8B, the step of forming the array substrate includes forming a pixel electrode layer 24, forming a common electrode layer 29, forming a plurality of common electrode lines 62 coupled to the common electrode layer 29 and substantially parallel to the plurality of gate lines 21, and forming a plurality of auxiliary conductive lines 61 (e.g., a plurality of auxiliary metal lines) coupled to the common electrode layer 29 and substantially parallel to the plurality of data lines 22.

Optionally, the plurality of auxiliary conductive lines 61 may be coupled to the common electrode layer 29 through a plurality of vias (shown as small squares in FIG. 8B).

By having both a plurality of auxiliary conductive lines 61 and a plurality of common electrode lines 62 in the curved display panel (e.g., in the array substrate 20), a network of conductive lines (e.g., a network of conductive metal lines) is formed in the curved display panel. The network of conductive lines is coupled to the common electrode layer 29. By having this design, an improved resistance uniformity of the common electrode layer 29 can be achieved. Various issues caused by resistance non-uniformity, such as green color shift and flicker, can be obviated.

In some embodiments, as shown in FIG. 8A, each of the plurality of auxiliary conductive lines 61 is formed between the two adjacent data lines 22 disposed between each two adjacent columns of subpixels of each of the plurality of groups of rows of subpixels. Optionally, the plurality of auxiliary conductive lines 61 and the plurality of data lines 22 are formed in a same layer, e.g., in a same patterning step. Optionally, the plurality of gate lines 21 and the plurality of common electrode lines 62 are formed in a same layer, e.g., in same patterning step.

In another aspect, the present invention provides a curved display apparatus having a curved display panel described herein or fabricated by a method described herein. In the present curved display apparatus, subpixels in a same pixel are consecutively arranged along the first direction, subpixels consecutively arranged along the second direction in a same row are of a same color from different pixels, and a display surface of the curved display apparatus is curved along a curvature direction substantially parallel to the second direction. Due to the subpixel arrangement of the present curved display apparatus, even if there is pixel misalignment between the array substrate and the coroner substrate, the light emitted from a subpixel in the array substrate is always filtered through a color filter unit of a same color in the counter substrate. Thus, the color mixing issue can be obviated.

Examples of appropriate curved display apparatuses includes, but are not limited to, an electronic paper, a mobile phone, a tablet computer, a television, a monitor, a notebook computer, a digital album, a GPS, etc.

The foregoing description of the embodiment is of the invention has been presented for purposes of illustration and description, it is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A curved display panel having an array of a plurality of pixels along a first direction and a second direction intersecting the first direction, comprising an array substrate and a counter substrate facing the array substrate;
　　wherein the array substrate comprises a plurality of gate lines, a plurality of data lines, a pixel electrode layer, a common electrode layer, a plurality of common electrode lines coupled to the common electrode layer and substantially parallel to the plurality of gate lines, and a plurality of auxiliary conductive lines coupled to the common electrode layer and substantially parallel to the plurality of data lines;
　　wherein a respective one of the plurality of auxiliary conductive lines is between the two adjacent data lines between two adjacent columns of subpixels of the respective one of the plurality of groups of rows of subpixels; and
　　the plurality of auxiliary conductive lines and the plurality of data lines are in a same layer;
　　wherein a respective one of the plurality of gate lines extends substantially along the second direction; a respective one of the plurality of data lines extends substantially along the first direction; a respective one of the plurality of pixels comprises at least three subpixels of different colors; the at least three subpixels in a same pixel are consecutively along the first direction; a plurality of subpixels consecutively along the second direction in a same row are of a same color from different pixels; the curved display panel comprises a display surface curved along a curvature direction; and the curvature direction is substantially parallel to the second direction;
　　wherein the counter substrate comprises a plurality of color filter layers of different colors and a black matrix layer; a respective one of the plurality of color filter layers comprises a plurality of color filter units of a same color; the respective one of the plurality of pixels comprises at least three color filter units of different colors; the at least three color filter units of different colors in a same pixel are consecutively along the first direction; and a plurality of color filter units consecutively in a same row along the second direction are of a same color from different pixels;
　　wherein the black matrix layer is absent in an inter-subpixel region between adjacent subpixels of a same color from different pixels along the second direction; two data lines of the plurality of data lines and one of the plurality of auxiliary conductive lines disposed between the two data lines of the plurality of data lines are in the inter-subpixel region between two adjacent subpixels of the same color from different pixels along the second direction, and are configured to form a fringe electric field with the common electrode layer to control a portion of a liquid crystal layer in the inter-subpixel region between two adjacent subpixels of the same color from different pixels along the second direction to be in a normally black state, thereby functioning as a black matrix shielding light in the inter-subpixel region between two adjacent subpixels of the same color from different pixels along the second direction.

2. The curved display panel of claim 1, wherein any light emitted from a subpixel and transmitted through a color filter unit corresponding to an adjacent subpixel due to pixel misalignment has a same color as light emitted from the subpixel and transmitted through a color filter unit corresponding to the subpixel.

3. The curved display panel of claim 1, comprising a plurality of groups of rows of subpixels along the first direction, a respective one of the plurality of groups of rows of subpixels comprising at least two adjacent rows of subpixels, subpixels in a respective one of the at least two adjacent rows of subpixels being along the second direction.

4. The curved display panel of claim 3, wherein the respective one of the plurality of groups of rows of subpixels comprising two adjacent rows of subpixels;
　　a respective one subpixel of the plurality of groups of rows of subpixels comprises a switching transistor;
　　the respective one of the plurality of groups of rows of subpixels is associated with one of the plurality of gate lines, which is between the two adjacent rows of subpixels of the respective one of the plurality of groups of rows of subpixels, and is coupled to a respective one switching transistor of the respective one subpixel of the plurality of groups of rows of subpixels;
　　two adjacent columns of subpixels of the respective one of the plurality of groups of rows of subpixels is associated with two adjacent data lines of the plurality of data lines, which are between the two adjacent columns of subpixels of the respective one of the plurality of groups of rows of subpixels; and
　　the two adjacent data lines associated with the two adjacent columns of subpixels of the respective one of the plurality of groups of rows of subpixels are respectively coupled to source electrodes of two switching transistors of two subpixels in different rows from the two adjacent columns of subpixels.

5. The curved display panel of claim 3, wherein the plurality of gate lines are configured to sequentially scan the plurality of groups of rows of subpixels group-by-group along the first direction in a plurality of scanning stages of a scanning cycle, the respective one of the plurality of groups of rows of subpixels being scanned in a same scanning stage of the scanning cycle.

6. The curved display panel of claim 3, wherein the respective one of the plurality of groups of rows of subpixels comprises four rows of subpixels, subpixels in four adjacent rows of subpixels being along the second direction.

7. The curved display panel of claim 1, wherein the plurality of color filter layers of different colors comprise a color filter layer of a first color, a color filter layer of a second color, and a color filter layer of a third color;
　　wherein the color filter layer of the first color comprises a plurality of rows of color filter units of the first color along the second direction;

the color filter layer of the second color comprises a plurality of rows of color filter units of the second color along the second direction;

the color filter layer of the third color comprises a plurality of rows of color filter units of the third color along the second direction; and a respective one of the plurality of pixels comprises one color filter unit of the first color, one color filter unit of the second color, and one color filter unit of the third color, consecutively along the first direction.

8. The curved display panel of claim 1, wherein the curved display panel comprises a curved liquid crystal display panel.

9. The curved display panel of claim 8, wherein the black matrix layer substantially covers transistors in subpixels of the curved display panel.

10. The curved display panel of claim 1, wherein the plurality of gate lines and the plurality of common electrode lines are in a same layer.

11. The curved display panel of claim 1, wherein the curved display panel comprises a curved organic light emitting diode display panel.

12. The curved display panel of claim 11, wherein the black matrix layer covers transistors in subpixels of the curved display panel.

13. A curved display apparatus, comprising the curved display panel of claim 1.

14. A method of fabricating a curved display panel, comprising:

forming a display panel comprising an array of a plurality of pixels along a first direction and a second direction intersecting the first direction; and curving the display panel along a curvature direction, the curvature direction being substantially parallel to the second direction;

wherein forming the display panel comprises forming an array substrate and forming a counter substrate facing the array substrate;

wherein forming the array substrate comprises forming a plurality of gate lines, forming a plurality of data lines, forming a pixel electrode layer, forming a common electrode layer, forming a plurality of common electrode lines coupled to the common electrode layer and substantially parallel to the plurality of gate lines, and forming a plurality of auxiliary conductive lines coupled to the common electrode layer and substantially parallel to the plurality of data lines;

wherein a respective one of the plurality of auxiliary conductive lines is formed between the two adjacent data lines between two adjacent columns of subpixels of the respective one of the plurality of groups of rows of subpixels; and the plurality of auxiliary conductive lines and the plurality of data lines are formed in a same layer;

wherein a respective one of the plurality of gate lines are formed to extend substantially along the second direction; a respective one of the plurality of data lines are formed to extend substantially along the first direction; a respective one of the plurality of pixels is formed to comprise at least three subpixels of different colors; the at least three subpixels in a same pixel are formed to be consecutively along the first direction; and a plurality of subpixels consecutively along the second direction in a same row are formed to be of a same color from different pixels wherein forming the counter substrate comprises forming a plurality of color filter layers of different colors and forming a black matrix layer; a respective one of the plurality of color filter layers is formed to comprise a plurality of color filter units of a same color; a respective one of the plurality of pixels is formed to comprise at least three color filter units of different colors; the at least three color filter units of different colors in a same pixel are formed to be consecutively along the first direction; and a plurality of color filter units consecutively in a same row along the second direction are of a same color from different pixels;

wherein the black matrix layer is formed to be absent in an inter-subpixel region between adjacent subpixels of a same color from different pixels along the second direction; and two data lines of the plurality of data lines and one of the plurality of auxiliary conductive lines disposed between the two data lines of the plurality of data lines are formed in the inter-subpixel region between two adjacent subpixels of the same color from different pixels along the second direction, and are configured to form a fringe electric field with the common electrode layer to control a portion of a liquid crystal layer in the inter-subpixel region between two adjacent subpixels of the same color from different pixels along the second direction to be in a normally black state, thereby functioning as a black matrix shielding light in the inter-subpixel region between two adjacent subpixels of the same color from different pixels along the second direction.

15. The method of claim 14, wherein forming the array substrate further comprises forming a plurality of groups of rows of subpixels along the first direction, the respective one of the plurality of groups of rows of subpixels being formed to comprise at least two adjacent rows of subpixels, subpixels in each of the at least two adjacent rows of subpixels being formed to be along the second direction.

16. The method of claim 15, wherein the plurality of gate lines are configured to sequentially scan the plurality of groups of rows of subpixels group-by-group along the first direction in a plurality of scanning stages of a scanning cycle, the respective one of the plurality of groups of rows of subpixels being scanned in a same scanning stage of the scanning cycle.

* * * * *